United States Patent
Suzuki et al.

(10) Patent No.: US 7,566,438 B2
(45) Date of Patent: *Jul. 28, 2009

(54) METHOD FOR MANUFACTURING NANOSTRUCTURED MANGANESE OXIDE HAVING DENDRITIC STRUCTURE, AND OXYGEN REDUCTION ELECTRODE COMPRISING NANOSTRUCTURED TRANSITION METAL OXIDE HAVING DENDRITIC STRUCTURE

(75) Inventors: Nobuyasu Suzuki, Nara (JP); Yasunori Morinaga, Nara (JP); Hidehiro Sasaki, Neyagawa (JP); Yuka Yamada, Nara (JP)

(73) Assignee: Panasonic Corporation, Osaka (JP)

( * ) Notice: Subject to any disclaimer, the term of this patent is extended or adjusted under 35 U.S.C. 154(b) by 769 days.

This patent is subject to a terminal disclaimer.

(21) Appl. No.: 11/219,714

(22) Filed: Sep. 7, 2005

(65) Prior Publication Data

US 2006/0001012 A1    Jan. 5, 2006

Related U.S. Application Data

(63) Continuation of application No. PCT/JP2005/002349, filed on Feb. 16, 2005.

(30) Foreign Application Priority Data

Feb. 20, 2004   (JP)   ............... 2004-044265
Jun. 15, 2004   (JP)   ............... 2004-176813

(51) Int. Cl.
    *C01G 45/00*   (2006.01)
(52) U.S. Cl. ............. 423/605; 204/298.13; 204/298.12; 204/192.12; 204/192.22; 252/518.1; 427/126.3; 428/698; 977/811
(58) Field of Classification Search ................. 423/605; 204/298.13, 298.12, 192.12, 192.22; 252/518.1; 427/126.3; 428/698; 977/811
See application file for complete search history.

(56) References Cited

U.S. PATENT DOCUMENTS

| 6,136,156 | A |   | 10/2000 | El-Shall et al. |
| 6,162,530 | A | * | 12/2000 | Xiao et al. ............... 428/292.1 |
| 6,630,257 | B2 | * | 10/2003 | Ye et al. ..................... 428/698 |
| 2002/0197493 | A1 |   | 12/2002 | Yamada et al. |

FOREIGN PATENT DOCUMENTS

| JP | 02-145432   | 6/1990  |
| JP | 10-302808   | 11/1998 |
| JP | 2001-048546 | 2/2001  |

* cited by examiner

*Primary Examiner*—Steven Bos
(74) *Attorney, Agent, or Firm*—McDermott Will & Emery LLP

(57) ABSTRACT

An object of the present invention is to provide an oxygen reduction electrode having excellent oxygen reduction properties (oxygen reduction catalyst abilities).

The present invention encompasses:
(1) A method for manufacturing a nanostructured manganese oxide having a dendritic structure formed from an agglomeration of primary particles, wherein the method comprises the steps of:
removing components from a target plate that comprises one or more kinds of manganese oxides by irradiating the target plate with laser light in an atmosphere comprising a mixed gas of inert gas and oxygen gas, the content of the oxygen gas in the mixed gas being no less than 0.05% but no more than 0.5% as measured by mass flow rate; and
depositing the removed components on a substrate that is opposed to the target plate substantially in parallel to obtain the nanostructured manganese oxide, and
(2) an oxygen reduction electrode comprising a nanostructured transition metal oxide having a dendritic structure formed from an agglomeration of primary particles.

17 Claims, 12 Drawing Sheets

Top View

Cross-Sectional View

Top View

Cross-sectional View

Top View

Cross-Sectional View

Top View

Cross-Sectional View (a) on-axis (b) off-axis

Top View

Cross-Sectional View

Deposition (Directly Supporting)

METHOD FOR MANUFACTURING NANOSTRUCTURED MANGANESE OXIDE HAVING DENDRITIC STRUCTURE, AND OXYGEN REDUCTION ELECTRODE COMPRISING NANOSTRUCTURED TRANSITION METAL OXIDE HAVING DENDRITIC STRUCTURE

REFERENCE TO RELATED APPLICATION

This Application is a continuation of International Application No. PCT/JP2005/002349, whose international filing date is Feb. 16, 2005, which in turn claims the benefit of Japanese Application No. 2004-44265, filed on Feb. 20, 2004 and Japanese Application No. 2004-176813, filed on Jun. 15, 2004, the disclosures of which Applications are incorporated by reference herein. The benefit of the filing and priority dates of the International and Japanese Applications is respectfully requested.

TECHNICAL FIELD

The present invention relates to a method for manufacturing a nanostructured manganese oxide having a dendritic structure, and an oxygen reduction electrode comprising a nanostructured transition metal oxide having a dendritic structure.

BACKGROUND OF THE INVENTION

To date, microstructured materials have been obtained by rapidly solidifying composite metal(s), alloy(s), compound(s), etc., and most of the obtained microstructured materials have particle sizes of several microns. In recent years, research has been actively conducted seeking to minimize the size of materials, i.e., from the micron to nanometer order. One of the primary characteristics of nanostructures, such as nanoparticles, is that a high percentage of atoms exist on the particle boundary (surface), for example, the ratio may reach 40% in 5 nm nanoparticles. Nanostructured materials may have chemical and physical characteristics that differ greatly from those of microstructured materials having the same chemical composition, and nanostructured materials often exhibit desirable characteristics.

However, it is currently difficult to obtain, for example, manganese oxides ($MnO_x$) in a nanostructured form. Usually, the particle size of transition metal oxides prepared for commercial use is in the level of microns. The characteristics of micron-scale manganese oxides when used as an oxygen reduction catalyst have been reported. For example, Patent Document 1 discloses that manganese oxide materials of different oxidation states (valencies) exhibit different catalytic activities, i.e., $Mn_2O_3$ and MnOOH, which are trivalent manganese compounds, have higher oxygen reduction catalytic activity than $Mn_3O_4$ and $Mn_5O_8$, which have different valencies, and the oxygen reduction potential of $Mn_2O_3$ and MnOOH is observed around −0.3 V and −1.0 V, respectively.

As a method for manufacturing nanostructured manganese dioxide ($MnO_2$), for example, a method is known wherein an aqueous potassium permanganate ($KMnO_4$) solution is sprayed onto an aqueous sulphuric acid solution comprising manganese sulfate ($MnSO_4$) dissolved therein to produce a synthetic reaction, a reaction product is separated out, and the reaction product is subjected to heat treatment to obtain manganese dioxide ($MnO_2$) (Patent Document 1, page 42, FIG. 2).

An example of an oxygen reduction electrode using a manganese oxide is an air-zinc battery, wherein a mixture of micron-scale trimanganese tetraoxide ($Mn_3O_4$) and manganese dioxide ($MnO_2$) powder is used as the oxygen reduction electrode (Patent Document 2, page 8, FIG. 2).

In addition to Patent Documents 1 and 2, Patent Documents 3 and 4, and non-Patent Documents 1 and 2 can be cited as reference material relevant to the present invention.

[Patent Document 1] Japanese national publication of the translated version of PCT application No. 2000-505040

[Patent Document 2] Japanese Unexamined Patent Publication No. 1998-302808

[Patent Document 3] Japanese Unexamined Patent Publication No. 2000-144387 (in particular, paragraph [0015])

[Patent Document 4] Japanese Unexamined Patent Publication No. 2003-306319

[Non-Patent Document 1] *Journal of The Electrochemical Society*, 149 (4) A504-A507 (2002)

[Non-Patent Document 2] *Laser Engineering*, Volume 28, Number 6, June 2000, pp. 348 to 353.

DISCLOSURE OF THE INVENTION

Problem to be Solved by the Invention

Nanostructured materials, which have a large surface area, are particularly useful for applications in which a chemical reaction mediated by an active center plays a significant role, i.e., catalytic applications. The larger the contact area such materials have with the ambient environment (gases, liquids, etc.), the better the catalytic reaction. Therefore, there is a clear advantage in forming catalytic materials so as to have a nanostructure.

Furthermore, when a transition metal oxide is used as a catalytic material for an oxygen reduction electrode, the lower the oxygen reduction electrode potential, the better. In terms of cost, the less support required, the better.

The present invention has been accomplished in light of the above points. A primary object of the present invention is to provide an oxygen reduction electrode having excellent oxygen reduction properties (oxygen reduction catalytic ability).

Means for Solving the Problem

The inventors conducted extensive research and found that the above object can be achieved by using materials having a specific microstructure as oxygen reduction electrodes. The present invention has been accomplished by the above findings.

In other words, the present invention relates to a method for manufacturing a nanostructured manganese oxide having a dendritic structure, and an oxygen reduction electrode comprising a nanostructured transition metal oxide having a dendritic structure.

1. A method for manufacturing a nanostructured manganese oxide having a dendritic structure formed from an agglomeration of primary particles, wherein the method comprises the steps of:

removing components from a target plate that comprises one or more kinds of manganese oxides by irradiating the target plate with laser light in an atmosphere comprising a mixed gas of inert gas and oxygen gas, the content of the oxygen gas in the mixed gas being no less than 0.05% but no more than 0.5% as measured by mass flow rate; and depositing the removed components on a substrate that is opposed to the target plate substantially in parallel to obtain the nanostructured manganese oxide.

2. The method of Item 1, wherein the oxygen reduction potential of the nanostructured manganese oxide is in the vicinity of −0.2 V in a cyclic voltammogram employing a cyclic voltammetry, the cyclic voltammetry using a three electrode cell in which the nanostructured manganese oxide is used as the working electrode, platinum is used as the counter electrode, silver/silver chloride is used as the reference electrode, and an aqueous 0.1 mol/l potassium hydroxide solution at pH 13 is used as the electrolyte.

3. The method of Item 1, wherein the inert gas is helium.

4. The method of Item 1, wherein the atmosphere is activated by being energized.

5. The method of Item 1, wherein the atmosphere has a pressure of at least 13.33 Pa but no more than 1333 Pa.

6. The method of Item 1, wherein the laser light is a pulsed laser light which has a pulse duration of at least 5 ns but no more than 20 ns.

7. The method of Item 1, wherein the laser light has an energy density of at least 0.5 J/cm$^2$ but no more than 2 J/cm$^2$.

8. The method of Item 1, wherein the target plate is a manganese oxide sintered body.

9. The method of Item 1, which further comprises a step of heating the obtained nanostructured manganese oxide.

10. The method of Item 1, wherein the pressure of the atmosphere is varied.

11. The method of Item 1, which further comprises a step of positioning the target plate and the substrate in a reaction system in such a manner that they are opposed to each other in parallel prior to all the other steps.

12. The method of Item 1, which further comprises a step of controlling at least one of 1) the pressure of the atmosphere, and 2) the distance between the target plate and the substrate, in order to control the size of the high-temperature and high-pressure region that is formed in the vicinity of the target plate by irradiating the target plate with laser light.

13. An oxygen reduction electrode comprising a nanostructured transition metal oxide having a dendritic structure formed from an agglomeration of primary particles.

14. The oxygen reduction electrode of Item 13, wherein the transition metal is manganese.

15. The oxygen reduction electrode of Item 13, wherein the primary particles have a mean diameter of at least 2 nm but no more than 20 nm.

16. The oxygen reduction electrode of Item 13, wherein the dendritic structure has a mean height of at least 1 μm but no more than 20 μm.

17. The oxygen reduction electrode of Item 13, wherein the primary particles have a mean diameter of at least 2 nm but no more than 20 nm, and the dendritic structure has a mean height of at least 1 μm but no more than 20 μm.

18. The oxygen reduction electrode of Item 13, wherein the oxygen reduction potential is in the vicinity of −0.2 V in a cyclic voltammogram employing a cyclic voltammetry, the cyclic voltammetry using a three electrode cell in which the oxygen reduction electrode is used as the working electrode, platinum is used as the counter electrode, silver/silver chloride is used as the reference electrode, and an aqueous 0.1 mol/l potassium hydroxide solution at pH 13 is used as the electrolyte.

19. The oxygen reduction electrode of Item 18, wherein the transition metal is manganese.

20. The oxygen reduction electrode of Item 13, wherein the nanostructured transition metal oxide comprises at least one transition metal oxide selected from the group consisting of transition metal monoxides, tritransition metal tetroxides, ditransition metal trioxides and transition metal dioxides.

21. The oxygen reduction electrode of Item 13, wherein the nanostructured transition metal oxide comprises at least one transition metal oxide selected from the group consisting of manganese monoxide, trimanganese tetroxide, dimanganese trioxide and manganese dioxide.

22. The oxygen reduction electrode of Item 13, wherein the nanostructured transition metal oxide is formed on an electrically conductive substrate.

23. The oxygen reduction electrode of Item 18, wherein the oxygen reduction potential of the oxygen reduction electrode is within the range of from −0.25 V to 0 V in the cyclic voltammogram.

24. The oxygen reduction electrode of Item 23, wherein the transition metal is manganese.

ADVANTAGES OF THE INVENTION

The manufacturing method of the present invention is used to produce a nanostructured transition metal oxide by conducting laser ablation in a so-called "on-axis" condition, and therefore it is possible to obtain a nanostructured transition metal oxide having a dendritic structure formed from an agglomeration of primary particles, these primary particles being the minimum constitutional unit for particles exhibiting high crystallinity.

Furthermore, the manufacturing method of the present invention makes it possible to control the valencies of the transition metal of the transition metal oxide and/or nanometer-scale finestructure by optimizing the interaction (e.g., colliding, scattering and entrapment effects) of the atmosphere with material (mainly atoms, ions, and clusters) emitted from the target material by the irradiation of a laser light.

The oxygen reduction electrode of the present invention comprises a nanostructured transition metal oxide having a dendritic structure formed from agglomeration of primary particles, which are the minimum constitutional unit for particles exhibiting high crystallinity, and therefore it has a large specific surface area and exhibits excellent catalytic activity. Therefore, the oxygen reduction electrode of the present invention has excellent abilities as an oxygen reduction catalyst.

EXPLANATION OF REFERENCE SYMBOLS

Figure 1:
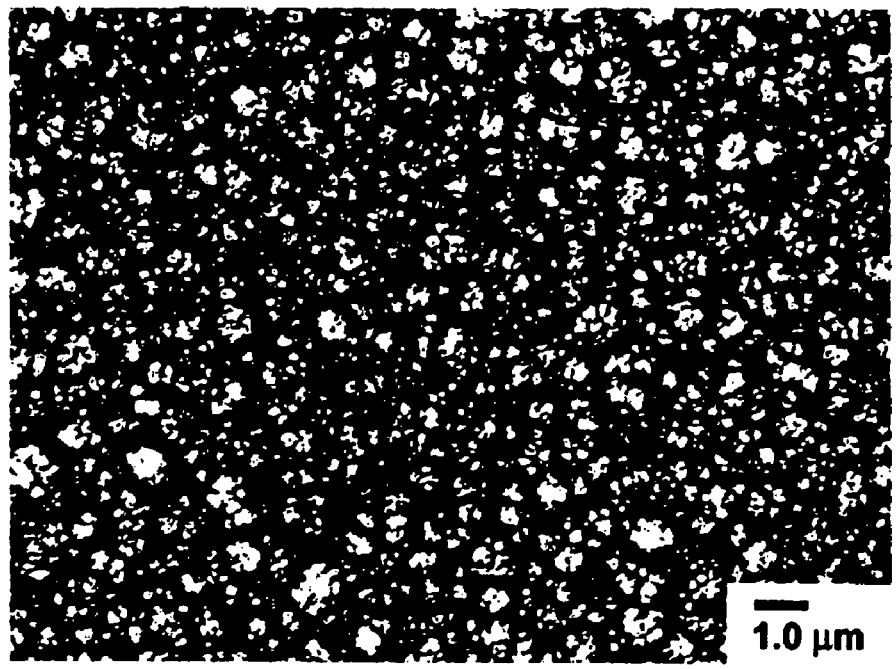
FIG. 1 is scanning electron micrographs of a nanostructured manganese oxide of Embodiment 1 of the present invention, which has a dendritic structure composed of an agglomeration of primary particles exhibiting high crystallinity.
Figure 1:
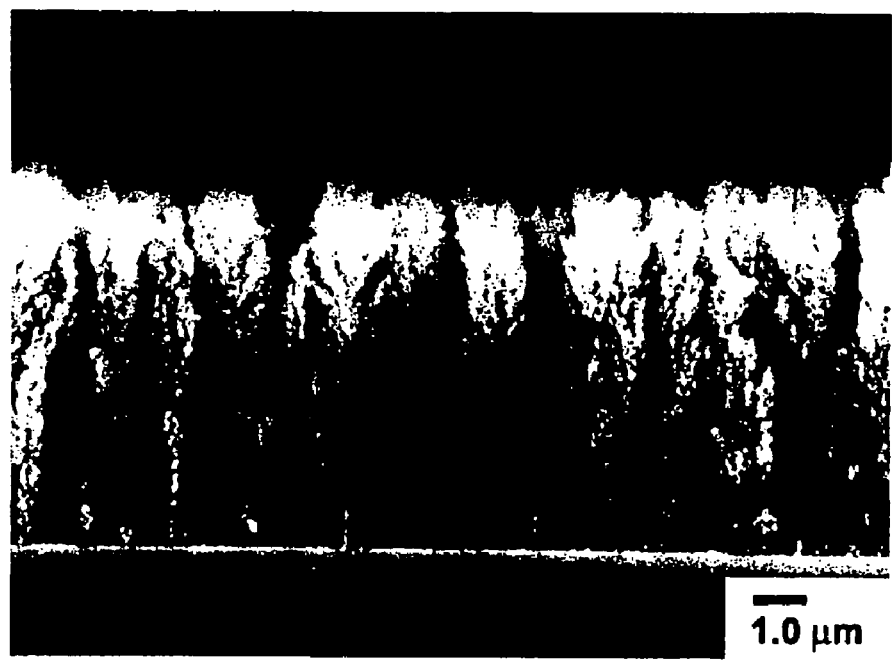

301 Reaction chamber
302 Ultra-high vacuum exhaust system
303a, 303b Massflow controllers
304 Gas introduction line
305 Gas exhaust system
306 Target holder
307 Target
308 Pulsed laser light source
309 Substrate
310 Laser introduction window
311 Slit
312 Lens
313 Reflecting mirror
314 Plume

BEST MODE FOR CARRYING OUT THE INVENTION

1. Oxygen Reduction Electrode

One of the main features of the oxygen reduction electrode of the present invention is that the oxygen reduction electrode comprises a nanostructured transition metal oxide having a dendritic structure formed from an agglomeration of primary particles. Note that "dendrite" is defined as a crystal growth structure wherein crystals branch out so that the branches linearly extend parallel to a specific crystal orientation, i.e., so-called arborescent crystal. However, the "dendritic structure" of the present specification means an agglomeration having a dendritic "appearance" (i.e., a tree-like appearance). Therefore, the "dendritic structure" of the present specification differs from dendritic crystal growth.

In the oxygen reduction electrode of the present invention, at least one nanostructured transition metal oxide having a dendritic structure composed of an agglomeration of primary particles is used as an electrode material (in particular, as an electrode active material (catalytic material)). A primary particle is a minimum constitutional unit, and preferably has a high crystallinity so that its crystal lattice can be clearly confirmed. By nanostructuring a transition metal oxide, it is possible to have more catalytic-active spots, attributable to fine primary particles, and achieve an excellent oxygen reduction catalytic ability, which cannot be obtained by ordinary bulk materials.

The electrode of the present invention may use not only a nanostructured transition metal oxide as an electrode material but also components of known oxygen reduction electrodes. For example, it is possible to use the electrode of the present invention in such a manner that the nanostructured transition metal oxide is formed on a conductive substrate.

The mean particle diameter of the primary particles is not limited, but is preferably in the range of from 2 nm to 20 nm, and more preferably from 3 nm to 7 nm.

The mean height of the dendritic structure (secondary structure) formed from agglomeration of primary particles is also not limited, but is preferably in the range of from 1 μm to 20 μm, and more preferably from 5 μm to 15 nm. Note that the height of the dendritic structure means the branch length of the dendrite crystal. The diameter of the branch of the dendritic structure (dendritic column) is also not limited, but is preferably in the range of from 0.5 μm to 5 μm. There is no restriction on the shape of the dendritic structure, and, for example, it can be in the form of a film.

It is preferable that the oxygen reduction electrode of the present invention has an oxygen reduction potential in the vicinity of −0.2 V (preferably in the range of from −0.25 V to 0 V) in a cyclic voltammogram employing a cyclic voltammetry, the cyclic voltammetry using a three electrode cell in which the above-described electrode is used as the working electrode, platinum as the counter electrode, silver/silver chloride as the reference electrode, and an aqueous 0.1 mol/l potassium hydroxide solution at pH 13 as the electrolyte. The thus-obtained electrode of the present invention can achieve oxygen reduction ability at a lower voltage compared to electrodes known in the art.

The above-mentioned cyclic voltammetry can be conducted under the conditions as described in Example 1. It is particularly preferable to use a test electrode that is prepared by forming a nanostructured transition metal oxide (diameter of 2 mm and thickness of 7 μm) on the center of circular top surface of glassy carbon 501 (diameter 3 mm×height 3 mm), and fixing this to a copper rod.

The components of the electrode and method of assembly thereof, etc., of the oxygen reduction electrode of the present invention are not limited as long as a nanostructured transition metal oxide is used as an electrode material. In other words, the oxygen reduction electrode of the present invention can be produced by, for example, using a nanostructured transition metal oxide obtained by the production method as described in the following section, as well as other known components, and by following a known assembly method.

2. A method for Producing a Nanostructured Transition Metal Oxide Having a Dendritic Structure A nanostructured manganese oxide having a dendritic structure formed from an agglomeration of primary particles can be suitably obtained by following the method described below.

A mixture of inert gas and oxygen is used as an atmosphere, wherein the content of oxygen in the atmosphere is at least 0.05% but no more than 0.5% as measured by mass flow rate, and the method comprises the steps of desorbing components from a target plate composed of manganese oxide(s) by irradiating the target plate with laser light in the atmosphere, and depositing the desorbed components on a substrate that is opposed to the target plate substantially in parallel.

As further described in the Embodiments and Examples below, in the manufacturing method of the present invention, the proportion of oxygen relative to inert gas (for example, in the Embodiments, He is exemplified) in the atmosphere is such that its content is in the range of from 0.05% to 0.5% as measured by mass flow rate.

When the oxygen mass flow ratio is less than 0.05%, particles agglomerate to form a nanostructure having a columnar structure, but it differs from the desired nanostructure (nanostructure which has a dendritic structure). When the oxygen mass flow ratio exceeds 0.5%, particles agglomerate to form a nanostructure having a cotton candy-like structure, but this also differs from the desired nanostructure.

The target plate and the substrate are disposed substantially in parallel. This is referred to as an "on-axis" condition. When they are disposed substantially non-parallel, i.e., in an "off-axis" condition, the desired nanostructure having a dendritic structure will not be obtained.

There is no limitation on the manganese oxide, which is a starting material for obtaining a nanostructure, as long as it can be used as a target material for subjection to irradiation with laser light, and various kinds of manganese oxides can be used. For example, at least one member selected from the group consisting of manganese monoxide (MnO), trimanganese tetroxide ($Mn_3O_4$), dimanganese trioxide ($Mn_2O_3$) and manganese dioxide ($MnO_2$) can be suitably used. In this case, it is desirable to select an oxide the same as that to be contained in the object nanostructured manganese oxide. For example, when a nanostructure of trimanganese tetroxide is to be obtained, it is desirable to use a target plate composed of a trimanganese tetroxide sintered body.

The manganese oxide may be crystalline or amorphous. Moreover, if the manganese oxide is crystalline, either a polycrystal or a singlecrystal can be used. Therefore, for example, a manganese oxide sintered body etc., can be suitably used.

The shape of a manganese oxide target plate is not limited as long as it is suitable for receiving irradiation of a laser light. For example, a manganese oxide with a thickness of from about 0.5 mm to about 10 mm can be suitably used as a target plate. The target plate may be such that a manganese oxide is deposited on a suitable support. The dimensions of the target plate may be suitably selected depending on the conditions for laser ablation, etc.

There is no particular limitation on the material for a substrate and it is possible to use substrates formed from various materials such as Si, $SiO_2$, etc.

In the present invention, components of the target plate are desorbed by irradiating the target plate with laser light, and the desorbed components are deposited on a substrate that is opposed to the target plate roughly in parallel. In other words, in the present invention, a laser ablation method (preferably, a pulsed laser ablation method) is used. The laser ablation method can be performed using a known reactor, etc.

The laser ablation method is such that the surface of a target is melted and desorbed by irradiating the target with laser light having a high energy density (particularly, 0.5 $J/cm^2$ or more, and preferably in the range of from 0.5 $J/cm^2$ to 2 $J/cm^2$). A pulsed laser ablation method is such that pulsed laser light is used as the laser light.

One of the main features of the laser ablation method is that it has non-thermal equilibrium properties and is conducted as a non-mass process. A specific example of the effects of these non-thermal equilibrium properties is that spatial and time selective excitation is possible. In particular, the laser ablation method is advantageous because of its spatial selective excitation properties. In prior-art thermal processes or plasma processes, a great large area of the reaction vessel, or the entire reaction vessel, is exposed to heat, ions, etc. In contrast, with the laser ablation method, it is possible to excite only the necessary source of material, and therefore it is a clean process by which contamination with impurities is reduced.

Moreover, a non-mass property indicates that the process causes remarkably less damage compared to the ion process which also has non-thermal equilibrium properties. The materials desorbed by laser ablation are mainly ions and neutral particles such as atoms, molecules, and clusters (consisting of a few to tens of atoms). The kinetic energy thereof reaches tens of eV in case of ions, and several eV in case of neutral particles. This is far higher than that of atoms evaporated by heating but far lower than an ion beam.

The laser ablation process, which is clean and causes little damage, is suitable for producing a nanostructure. When the laser ablation process is employed, it is possible to control the contamination with impurities, composition, crystallinity, etc., of the obtained nanostructure. In order to produce a nanostructure by employing the laser ablation method, it is desirable that the target material absorbs a light having the same wavelength band as that of the laser light that is emitted from the light source.

In the production method of the present invention, when a pulsed laser light is used as a laser light, it is preferable that the pulse duration be at least 5 ns but no more than 20 ns. Furthermore, it is usually preferable that the wavelength be at least 150 nm but no more than 700 nm. It is usually preferable that the pulse energy be at least 10 mJ but no more than 500 mJ. It is also usually preferable that the repetition frequency be at least 5 Hz but no more and than 1 KHz.

The laser medium (type of laser) for producing laser light is not limited, and can be, for example, a gas laser, such as an excimer laser, or a solid laser, such as a YAG laser. It is especially desirable to use an excimer laser (in particular, an excimer laser in which a halogen gas and a noble gas are used as the laser medium). For example, an ArF excimer laser which uses fluorine gas and argon as a laser medium can be suitably used.

Figure 3:
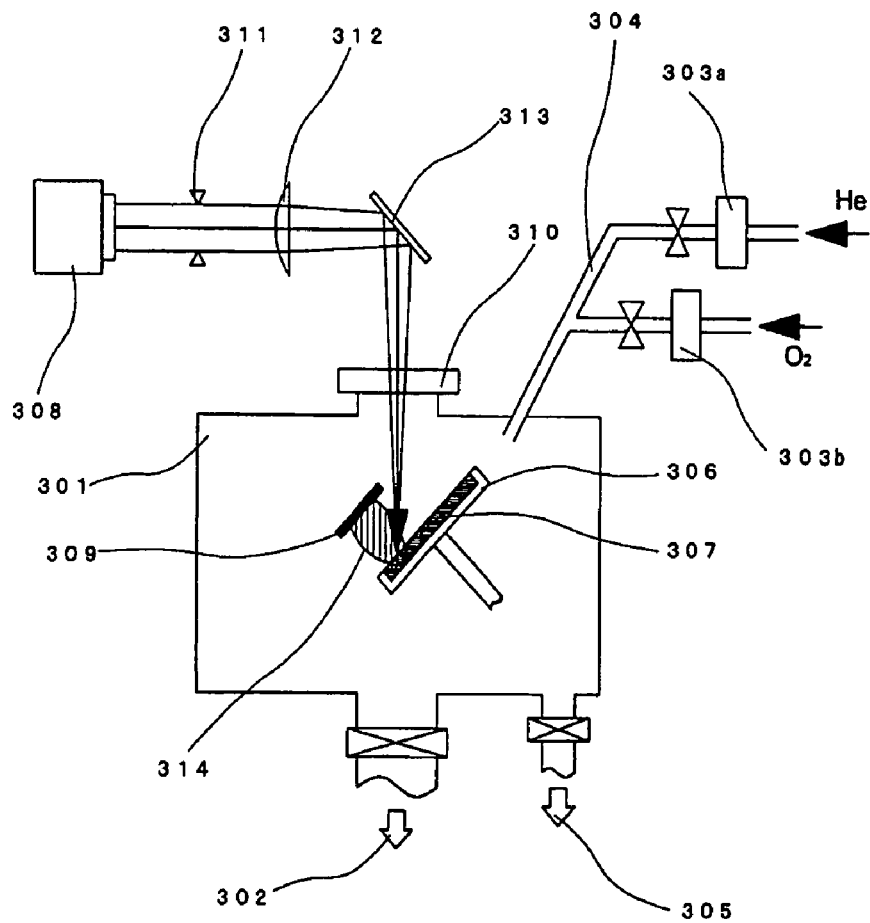
FIG. 3 is a block diagram showing a nanostructure-production equipment set-up used for manufacturing nanostructured manganese oxide of Embodiments of the present invention.

In the present invention, the material desorbed from the target plate is deposited on a substrate that is disposed substantially parallel with the target plate (FIG. 3). In other words, the desorbed material is deposited on the substrate under conditions where the target plate and the substrate are disposed substantially in parallel. This method employs a so-called on-axis condition and differs from methods that employ a so-called off-axis condition (i.e., method wherein the desorbed material is deposited on substrates under conditions where the target plate and the substrate are disposed substantially perpendicular to each other). By depositing the material in an on-axis condition, in the present invention, the finally obtained nanostructured manganese oxide exhibits better oxygen reduction properties compared to that employing an off-axis condition.

Therefore, when the laser ablation method under an on-axis condition is performed, using a known reactor, etc., it is desirable that the target plate and the substrate be set-up in the reaction system in such a manner that they are opposed to each other in parallel beforehand.

When a reactor is used, at least one of 1) the pressure of the atmosphere, and 2) the distance between the target plate and the substrate may be controlled, in order to control the size of the high-temperature and high-pressure region that is formed in the vicinity of the target plate by irradiating the target plate with the beam light. This makes it possible to effectively form a nanostructured manganese oxide on a substrate.

In the production method of the present invention, a mixed gas of inert gas and a reactant gas (oxygen) is used as the atmosphere. Compared to a case where only an inert gas is used, the influence of the reactive gas source remaining in the chamber, etc., is negligibly small in this method.

For example, Ar, He, $N_2$, etc., can be used as an inert gas. Among these, He is preferable.

The content of oxygen in the atmosphere (mixed gas) as measured by mass flow rate is not limited as long as it falls in the range of from 0.05% to 0.5%, and preferably from 0.1% to 0.3%.

The pressure of the atmosphere can be suitably selected depending on the composition of the atmosphere. In order to produce a nanostructured manganese oxide having a composition the same as that of the target material, it is preferable that the pressure of the atmosphere be in the range of from 13.33 Pa to 1333 Pa.

In the present invention, it is possible to vary the pressure of the atmosphere, if necessary. This makes it possible to control the structure (dendritic structure) of the nanostructure in the deposition direction, and the properties of the nanostructured manganese oxide.

It is also possible to activate atmosphere by energizing the atmosphere, whereby the valency of the manganese can be increased. Specific examples of methods for energizing the atmosphere include ultraviolet radiation irradiation, electron beam irradiation, etc.

By depositing the material desorbed from the target plate on the substrate, a nanostructured manganese oxide having a dendritic structure in which primary particles agglomerate on the substrate can eventually be obtained. Usually, material (atoms, molecules, ions, clusters, etc.) desorbed from the target plate by the laser ablation method deposits on the substrate while agglomerating or growing, and a nanostructured manganese oxide having a secondary structure (dendritic structure) in which primary particles are agglomerated is eventually formed on the substrate.

In the present invention, if necessary, the thus-obtained nanostructured manganese oxide may be heated. The oxidation number of the manganese oxide can be increased by heating. For example, when the nanostructured manganese oxide is formed of trimanganese tetroxide ($Mn_3O_4$), dimanganese trioxide ($Mn_2O_3$) can be obtained by heating the nanostructured manganese oxide in an oxidizing atmosphere. The heating temperature is not limited, but is usually 600° C. or more. The upper limit thereof can be suitably selected.

A nanostructured manganese oxide obtained by the production method of the present invention has a secondary structure (dendritic structure) wherein primary particles are agglomerated. Thus, attributable to these fine primary particles, it is possible to obtain a great many catalytic-active spots, and accelerate effective diffusion of reactants, depending on the size of the secondary structure.

The mean particle diameter of the primary particles composing the secondary structure, and the shape and dimensions of the secondary structure, are as described above.

Hereunder, methods for producing nanostructured manganese oxides are specifically explained with reference to drawings and by being dividing into Embodiments.

EMBODIMENT 1

In Embodiment 1, a nanostructure formed of manganese oxide ($MnO_x$) and a method for producing the same are explained.

FIG. 1 shows scanning electron micrographs of a nanostructured manganese oxide of Embodiment 1 of the present invention. As is clear from the top view in FIG. 1, in the nanostructured manganese oxide, primary particles have agglomerated to form a secondary structure of hundreds of nm. As is clear from the cross-sectional view of FIG. 1, the secondary structure has a dendritic structure having a height of about 7.5 μm. Furthermore, as is clear from the transmission electron micrograph of FIG. 2, the primary particles are several nm in diameter with an extremely high crystallinity in which the crystal lattice can be clearly observed.

A method for producing a nanostructured manganese oxide having a dendritic structure as shown in FIG. 1 is described hereafter.

In Embodiment 1, a manganese oxide is deposited on the substrate by laser ablation under an atmosphere. Note that in this laser ablation method, the surface of the target is melted and desorbed by irradiating the target material with laser light having a high energy density (pulsed energy of about 1.0 $J/cm^2$ or more).

One of the main features of the laser ablation method is that it has non-thermal equilibrium properties and is conducted as a non-mass process. A specific example of the profitable effects of these non-thermal equilibrium properties is that spatial and time selective excitation is possible. In particular, the laser ablation method is advantageous because of its spatial selective excitation properties. In prior-art thermal processes or plasma processes, a great large area of the reaction vessel, or the entire reaction vessel, is exposed to heat, ions, etc. In contrast, with the laser ablation method, it is possible to excite only the necessary source of material, and therefore it is a clean process by which contamination with impurities is reduced.

Moreover, a non-mass property indicates that the process causes remarkably less damage compared to the ion process which also has non-thermal equilibrium properties. The materials desorbed by laser ablation are atoms, molecules, and clusters (consisting of a few to tens of atoms), which are mainly composed of ions and neutral particles, and the kinetic energy thereof reaches tens of eV in case of ions, and several eV in case of neutral particles. This is far higher than that of atoms evaporated by heating but far lower than an ion beam.

The laser ablation process, which is clean and causes little damage, is suitable for producing a nanostructure. When the laser ablation process is employed, it is possible to control the contamination with impurities, composition, crystallinity, etc., of the obtained nanostructure. In order to produce a nanostructure by employing the laser ablation method, it is desirable that the target material absorbs the same wavelength band as that of the laser light that is emitted from the light source.

FIG. 3 is a diagram showing a nanostructure-production equipment set-up used for producing a nanostructured manganese oxide of the present invention. Explained below is a case wherein a nanostructured manganese oxide having a dendritic structure as shown in FIG. 1 is produced by using a target formed of a manganese monoxide sintered body, and conducting laser ablation using a mixed gas of He and oxygen ($O_2$) as the atmosphere.

In FIG. 3, reference symbol 301 indicates a metal reaction chamber in which the target is placed. An ultra-high vacuum exhaust system 302 that provides the reaction chamber 301 with an ultra-high vacuum by evacuating the reaction chamber 301 is provided at the bottom of the reaction chamber 301. A gas introduction line 304 for supplying the atmosphere to the reaction chamber 301 is attached to the reaction chamber 301. Massflow controllers 303*a* and 303*b* are attached to this gas introduction line 304 to control the flow rate of the atmosphere that is supplied to the reaction chamber 301. A gas exhaust system 305 is provided at the bottom of the reaction chamber 301 to perform differential pumping of the atmosphere in the reaction chamber 301.

A target holder 306 for holding the target 307 is disposed in the reaction chamber 301 and a rotation shaft is attached to the target holder 306. The target 307 is configured so as to rotate (8 rpm) when the rotation shaft is rotated by a rotation controller (not shown). A deposition substrate 309 is so disposed as to be opposed to the front surface of the target 307. The materials desorbed and emitted from the target 307 that is excited by irradiation of laser light deposit on the deposition substrate 309. In this embodiment, a target formed of manganese monoxide (MnO) polycrystalline sintered-body (99.9% purity) is used.

Figure 9:
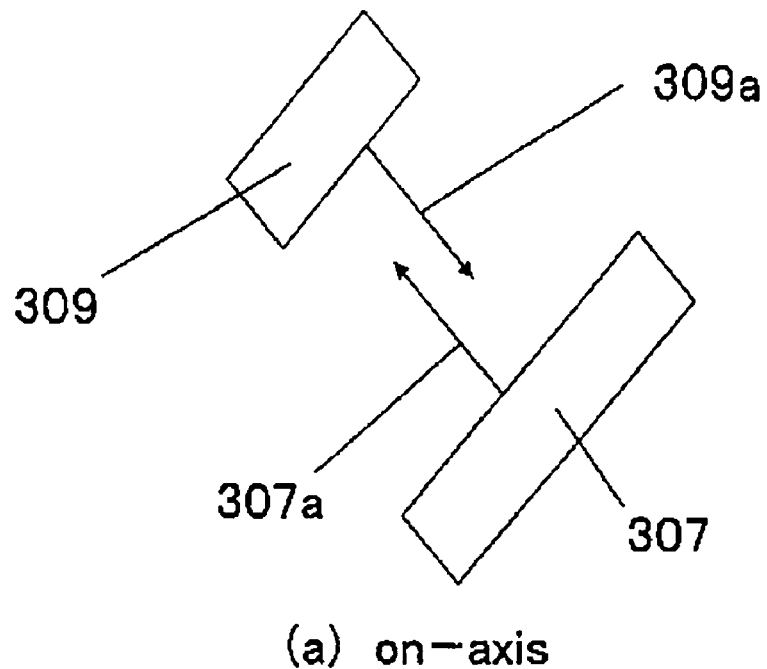
FIG. 9(a) is a diagram showing an "on-axis" condition.
FIG. 9(b) is a diagram showing an "off-axis" condition.
Figure 9:
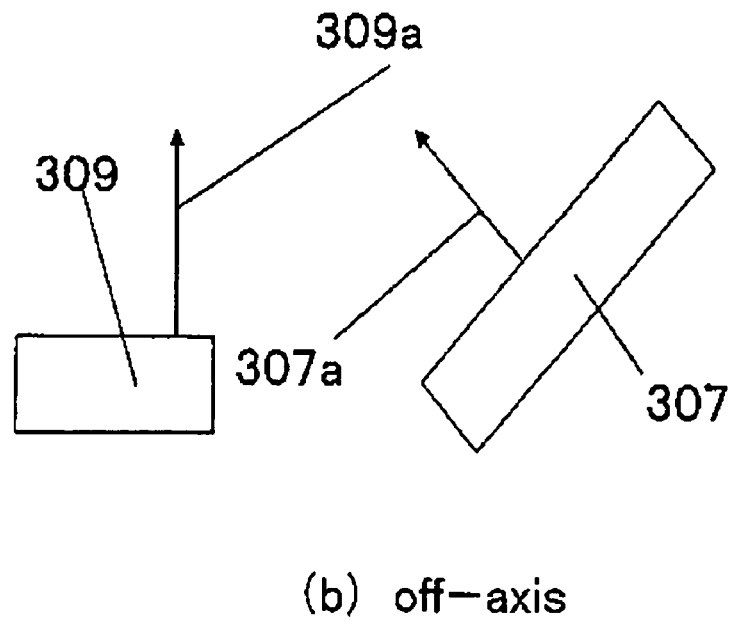

In Embodiment 1, the target 307 and the deposition substrate 309 are arranged in an on-axis condition. This holds also true of Embodiments 2 and 3 described later. Hereunder, "on-axis" and "off-axis" conditions are explained with reference to FIG. 9. FIG. 9(a) shows an "on-axis" condition, and FIG. 9 (b) shows an "off-axis" condition. As shown in FIG. 9(a), in the "on-axis" condition, the target 307 and the deposition substrate 309 are parallel. In other words, in the "on-axis" condition, a normal line 307a of the target 307 (i.e., a line perpendicular to the surface of the flat target 307) is parallel to a normal line 309a of the deposition substrate 309 (i.e., a line perpendicular to the surface of the flat deposition substrate 309).

In contrast, as shown in FIG. 9(b), the target 307 and the deposition substrate 309 are not in parallel in an "off-axis" condition. In other words, in the "off-axis" condition, the normal line 307a of the target 307 (i.e., a line perpendicular to the surface of the flat target 307) and the normal line 309a of the deposition substrate 309 (i.e., a line perpendicular to the surface of the flat deposition substrate 309) are not parallel.

In order to produce a nanostructure having the dendritic structure of the present invention, an "on-axis" condition is necessary. As explained in Comparative Example 3 described later, a nanostructure having the dendritic structure might not be obtained in an "off-axis" condition.

A pulsed laser light source 308 for irradiating laser light as an energy beam to the target 307 is located outside the reaction chamber 301. A laser introduction window 310 is provided in the top of the reaction chamber 301 for introducing the laser light into the reaction chamber 301. In the light path of the laser light emitted from the pulsed laser light source 308, a slit 311, lens 312, and reflecting mirror 313 are disposed in that order from the laser light source 308. The laser light emitted from the pulsed laser light source 308 is subjected to waveform shaping by the slit 311, collected by the lens 312, reflected by the reflecting mirror 313, passes through the laser introduction window 310, and irradiates the target 307 that is placed in the reaction chamber 301.

Operation of the nanostructure production equipment having the above-described structure is explained below. After evacuating the reaction chamber 301 to the ultimate vacuum of $1.0 \times 10^{-6}$ Pa using an ultra-high vacuum exhaust system 302 that comprises a turbo-molecular pump as a main component, He and $O_2$ are introduced into the reaction chamber 301 from the gas introduction line 304 via the massflow controllers 303a and 303b. In this embodiment, He gas and $O_2$ gas are introduced at 495.5 sccm and 0.5 sccm as measured by mass flow rate, respectively (therefore, the ratio of $O_2$ relative to He as measured by mass flow rate is 0.1%). Here, by conducting gas introduction in accordance with the operation of the gas exhaust system 305 comprising a scroll pump or a helical groove pump as a main component, it is possible to bring the pressure of the ambient noble gas in the reaction chamber 101 to within the range of from about 13.33 to about 1333 Pa.

In this condition, laser light is emitted from the pulsed laser light source 308 toward the surface of the target 307 composed of the MnO polycrystalline sintered-body (99.9% purity) that is disposed in the target holder 306 having a self-rotation mechanism. In this embodiment, an argon fluorine (ArF) excimer laser (wavelength: 193 nm, pulse duration: 12 ns, and pulse energy: 50 mJ, energy density: 1 J/cm$^2$, and repetition frequency: 10 Hz) is used. At this time, a laser ablation phenomenon occurs at the surface of the MnO target 307, and ions and neutral particles (atoms, molecules, clusters, etc.) such as Mn, O, and MnO are desorbed. The ions initially have the kinetic energy of 50 eV and neutral particles initially have the kinetic energy of 5 eV, and the ions and neutral particles are emitted mainly in the direction of the normal line of the target while maintaining the dimensions of the molecular- or cluster-level. The desorbed materials collide with atoms in the noble gas-containing atmosphere, and therefore their heading direction becomes disorderly and their kinetic energy dissipates in the atmosphere. The desorbed materials then deposit on the deposition substrate 309, which is disposed about 35 mm from the opposing target 307, forming a nanostructure. Note that the temperature of the substrate and target are not subjected to active control.

A mixed gas of $O_2$ and He is used as an atmosphere in the present embodiment; however, Ar, Kr, Xe, $N_2$ and other inert gases can be used instead of He gas. In this case, all that is necessary is to control the pressure of the atmosphere so that its density is the same as that of the mixture of He gas and $O_2$ gas.

Evaluation was conducted with respect to a microstructured manganese oxide obtained by arranging the pressure of the mixture of He and $O_2$ at 662 Pa, having the same mass as He at 667 Pa, by following the above-described method, and conducting deposition for 1000 seconds.

Figure 2:
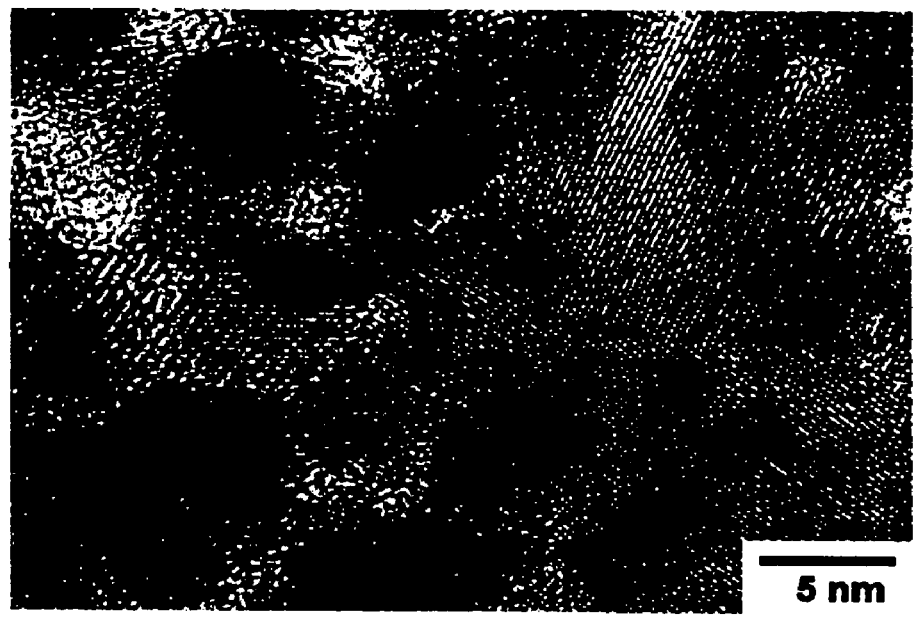
FIG. 2 is a transmission electron micrograph of a nanostructured manganese oxide of Embodiment 1 of the present invention, which has a dendritic structure composed of an agglomeration of primary particles exhibiting high crystallinity.

As shown in FIGS. 1 and 2, the deposited manganese oxide forms a nanostructure wherein primary particles exhibiting high crystallinity and a minimum constitutional unit of several nm are agglomerated to form a dendritic structure having a height of about 7.5 μm.

As described above, by employing the method for producing the nanostructured manganese oxide of Embodiment 1, it is possible to form a nanostructured manganese oxide having a dendritic structure in which primary particles (the primary particles are formed from the minimum constitutional unit for particles having high crystalinity) are agglomerated.

The target material is not limited to a manganese monoxide polycrystalline sintered body, and it is possible to use dimanganese trioxide, trimanganese tetroxide, etc., which have valencies different from that of manganese monoxide, and a monocrystaline target.

EMBODIMENT 2

Embodiment 2 explains a manganese oxide ($MnO_x$) nanostructure obtained under conditions different from those of Embodiment 1 (in particular, the mass flow rate and the pressure of the mixed-gas atmosphere are different from those of Embodiment 1), and the production method thereof.

Figure 4:
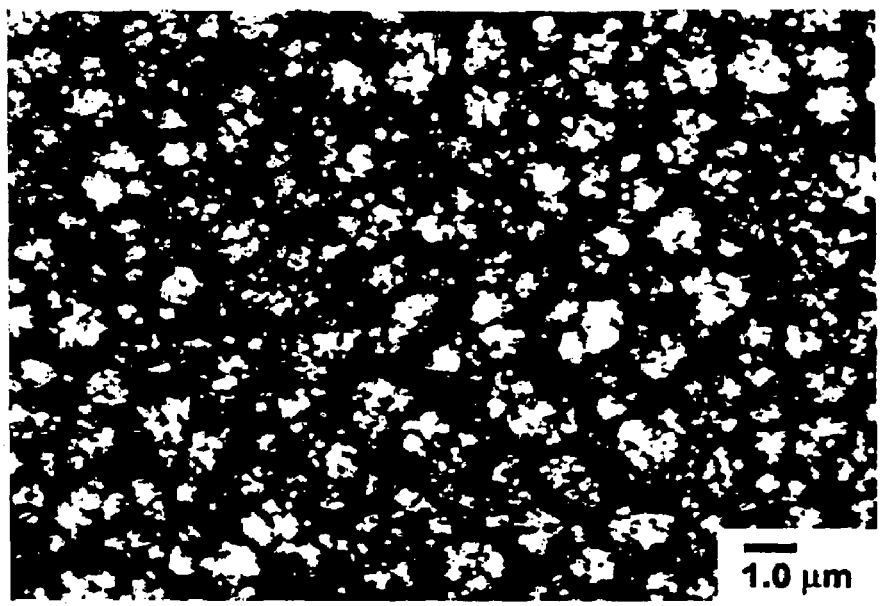
FIG. 4 is scanning electron micrographs of a nanostructured manganese oxide of Embodiment 2 of the present invention, which has a dendritic structure composed of an agglomeration of primary particles exhibiting high crystallinity.
Figure 4:

FIG. 4 is scanning electron micrographs of a nanostructured manganese oxide of Embodiment 2. As is clear from the top view of FIG. 4, in this nanostructured manganese oxide, primary particles have agglomerated to form a secondary structure of hundreds of nm. As is also clear from the cross-sectional view of FIG. 4, the secondary structure has a dendritic structure having a height of about 14 μm. Furthermore, as is clear from the transmission electron micrograph of FIG. 5, the primary particles are several to about 10 nm in diameter with an extremely high crystalinity in which the crystal lattice can clearly be observed.

Nanostructured manganese oxide having a dendritic structure as shown in FIG. 4 can be produced in the same manner as in Embodiment 1 except for the following points. That is, in Embodiment 2, He gas is supplied at 499 sccm, and $O_2$ gas is supplied at 1.0 sccm as measured by mass flow rate (therefore, the ratio of the mass flow rate of $O_2$ gas relative to that of He gas is 0.20%). The pressure of the mixture of He and $O_2$ is 657 Pa, which corresponds to 667 Pa of the same mass of He.

Figure 5:
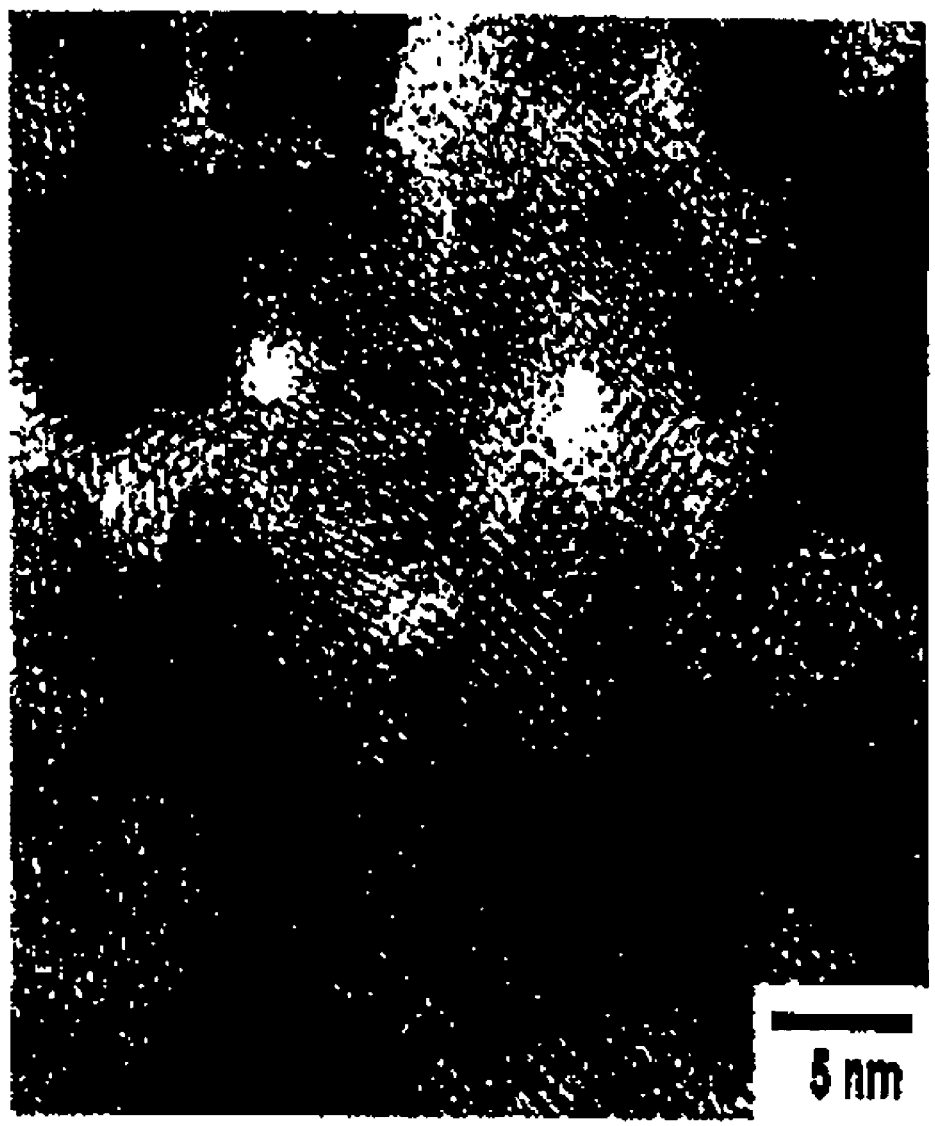
FIG. 5 is a transmission electron micrograph of a nanostructured manganese oxide of Embodiment 2 of the present invention, which has a dendritic structure composed of an agglomeration of primary particles exhibiting high crystallinity.

As shown in FIGS. 4 and 5, the deposited manganese oxide forms a nanostructure wherein primary particles exhibiting high crystallinity and a minimum constitutional unit of several nm are agglomerated to form a dendritic structure having a height of about 14 μm.

EMBODIMENT 3

Embodiment 3 explains a nanostructured manganese oxide ($MnO_x$) obtained under conditions different from those of Embodiments 1 and 2 (in particular, the mass flow rate and the pressure of the mixed-gas atmosphere are different from those of Embodiments 1 and 2), and a production method thereof.

Figure 6:
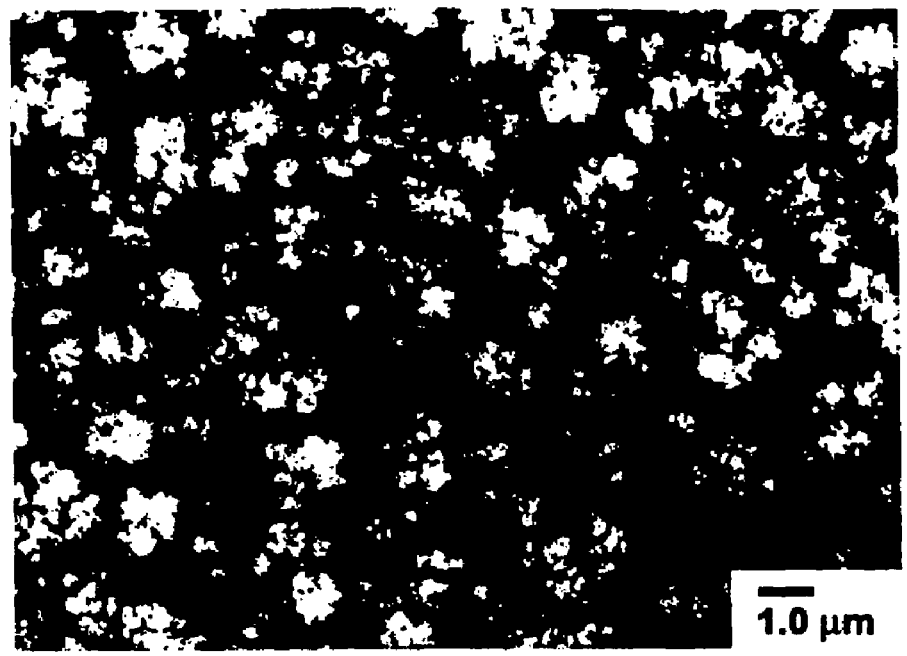
FIG. 6 is scanning electron micrographs of a nanostructured manganese oxide of Embodiment 3 of the present invention, which has a dendritic structure composed of an agglomeration of primary particles exhibiting high crystallinity.
Figure 6:

FIG. 6 is scanning electron micrographs of a nanostructured manganese oxide of the present Embodiment. As is clear from the top view of FIG. 6, in this nanostructured manganese oxide, primary particles have agglomerated to form a secondary structure of several μm. As is also clear from the cross-sectional view of FIG. 6, the secondary structure has a dendritic structure having a height of about 2.5 μm. Furthermore, as is clear from the transmission electron micrograph of FIG. 7, the primary particles are several to about 10 nm in diameter with an extremely high crystalinity in which the crystal lattice can clearly be observed.

Nanostructured manganese oxide having a dendritic structure shown in FIG. 6 can be produced in the same manner as in Embodiment 1 except for the following points. That is, in Embodiment 3, He is supplied at 497.5 sccm, and $O_2$ is supplied at 2.5 sccm as measured by mass flow rate (therefore, the ratio of the mass flow rate of $O_2$ relative to that of He is 0.50%). The pressure of the mixture of He and $O_2$ is 644 Pa, which corresponds to 667 Pa of the same mass of He.

Figure 7:
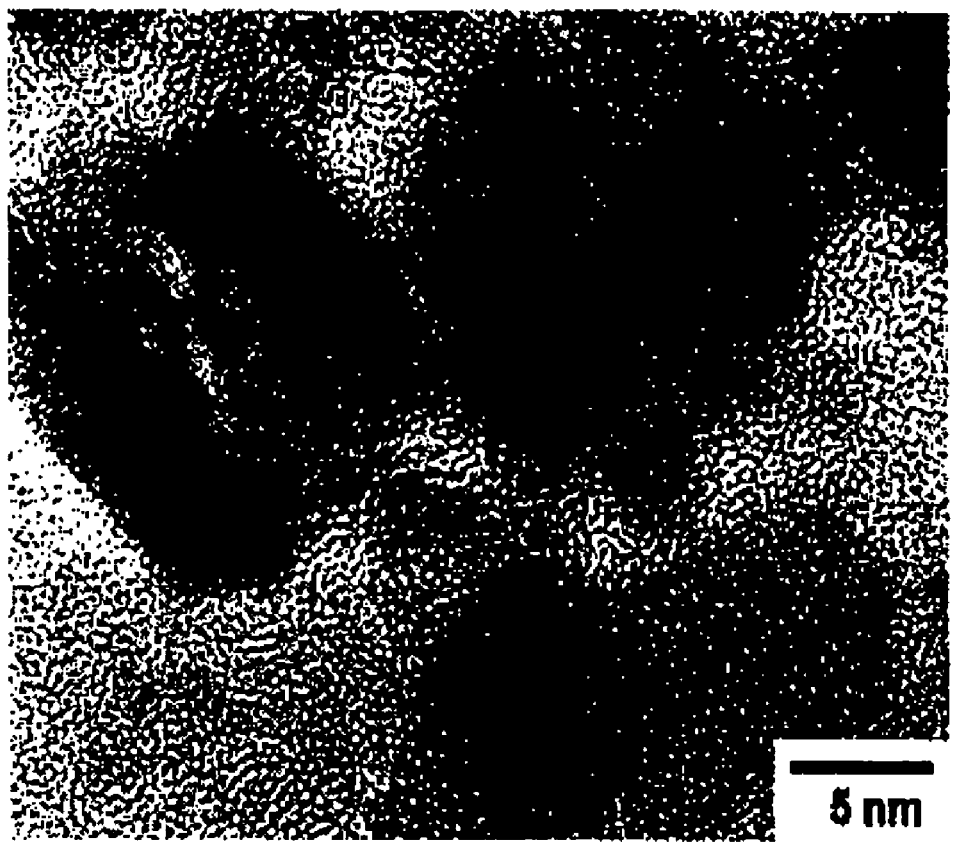
FIG. 7 is a transmission electron micrograph of a nanostructured manganese oxide of Embodiment 3 of the present invention, which has a dendritic structure composed of an agglomeration of primary particles exhibiting high crystallinity.

As shown in FIGS. 6 and 7, the deposited manganese oxide forms a nanostructure wherein primary particles exhibiting high crystallinity and a minimum constitutional unit of several nm are agglomerated to form a dendritic structure having a height of about 2.5 μm.

EXAMPLES

The following Examples and Comparative Examples are intended to illustrate the present invention in further detail.

Example 1

A test electrode was prepared using a nanostructured manganese oxide having a dendritic structure, composed of particulate highly crystalline minimum constitutional units, as shown in FIG. 4.

Figure 11:
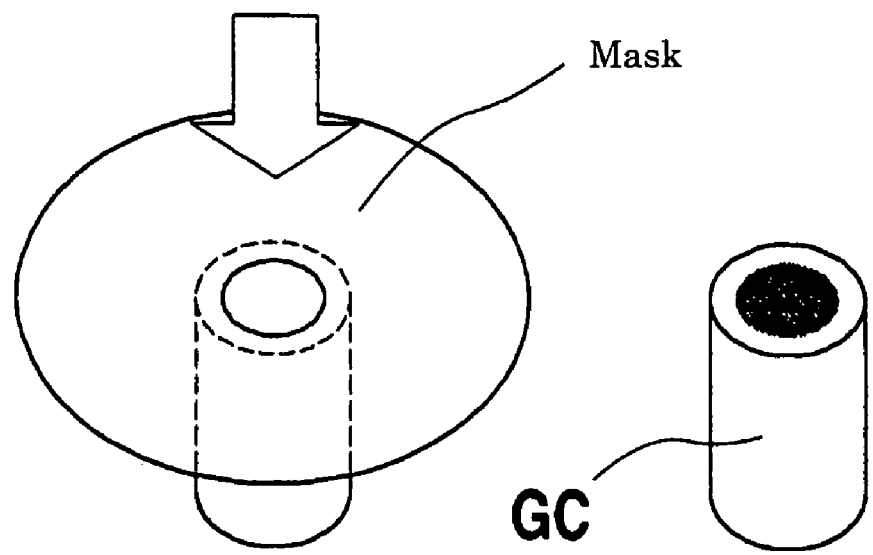
FIG. 11 is a schematic diagram showing the mask used in Example 1.
Figure 12:
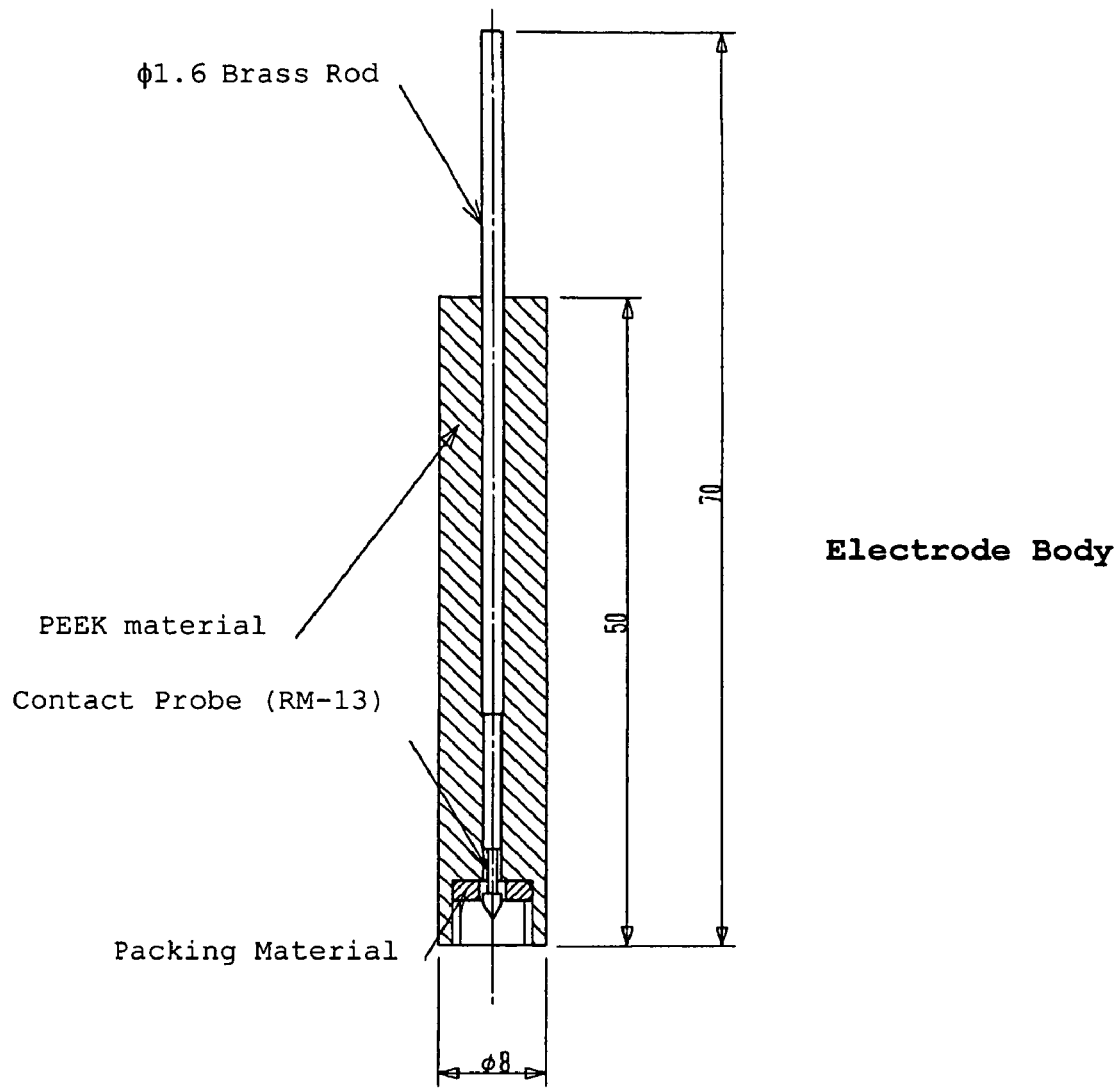
FIG. 12 is a schematic diagram showing the electrode used in Example 1.
Figure 12:
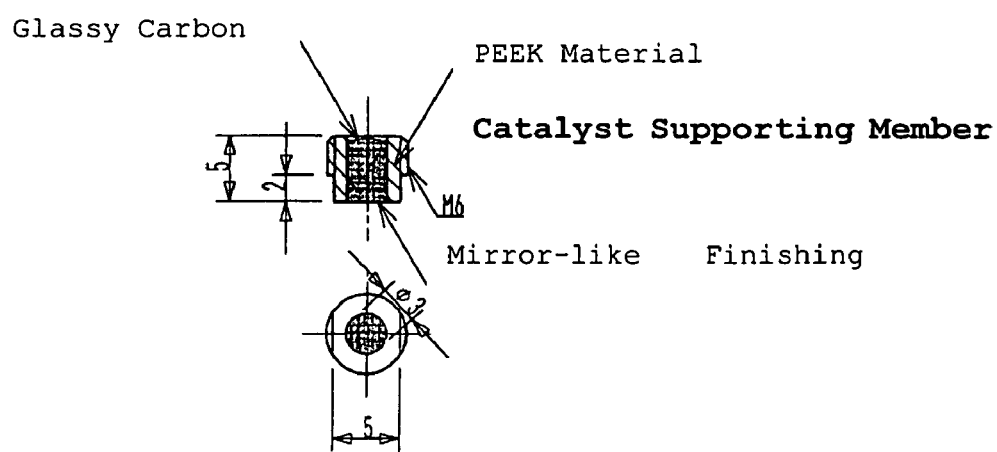

The test electrode was prepared by the procedure as described below. First, manganese oxide was directly deposited (supported) on a 3 mm diameter glassy carbon through a mask having an aperture of 2 mm in diameter as schematically shown in FIG. 11 by following the method as described in Embodiment 1 to form nanostructured manganese oxide having a dendritic structure with a thickness (height) of about 14 μm. As shown in FIG. 12, the catalyst-supporting member of the test electrode was so structured that a 3 mm diameter glassy carbon subjected to mirror-like finishing was press-fit in a PEEK material having a 6 mm external thread thereaound. Second, the catalyst-supporting member that directly supports the nanostructured manganese oxide having a dendritic structure was tightly placed in the body of the electrode as shown in FIG. 12, obtaining electric contact and water repellency attributable to a packing material. Takeout of the electric current from the test electrode was performed through a 1.6 mm diameter brass rod provided in the electrode body.

Using a test electrode prepared by the above-described method, the oxygen reduction catalytic ability was evaluated by cyclic voltammetry method using a three electrode cell. The evaluation was conducted under an oxygen atmosphere, using the test electrode as the working electrode, and saturate-dissolving oxygen in an aqueous 0.1 mol/l potassium hydroxide solution (pH 13). Platinum was used as the counter electrode, and silver/silver chloride as the reference electrode.

Figure 13:
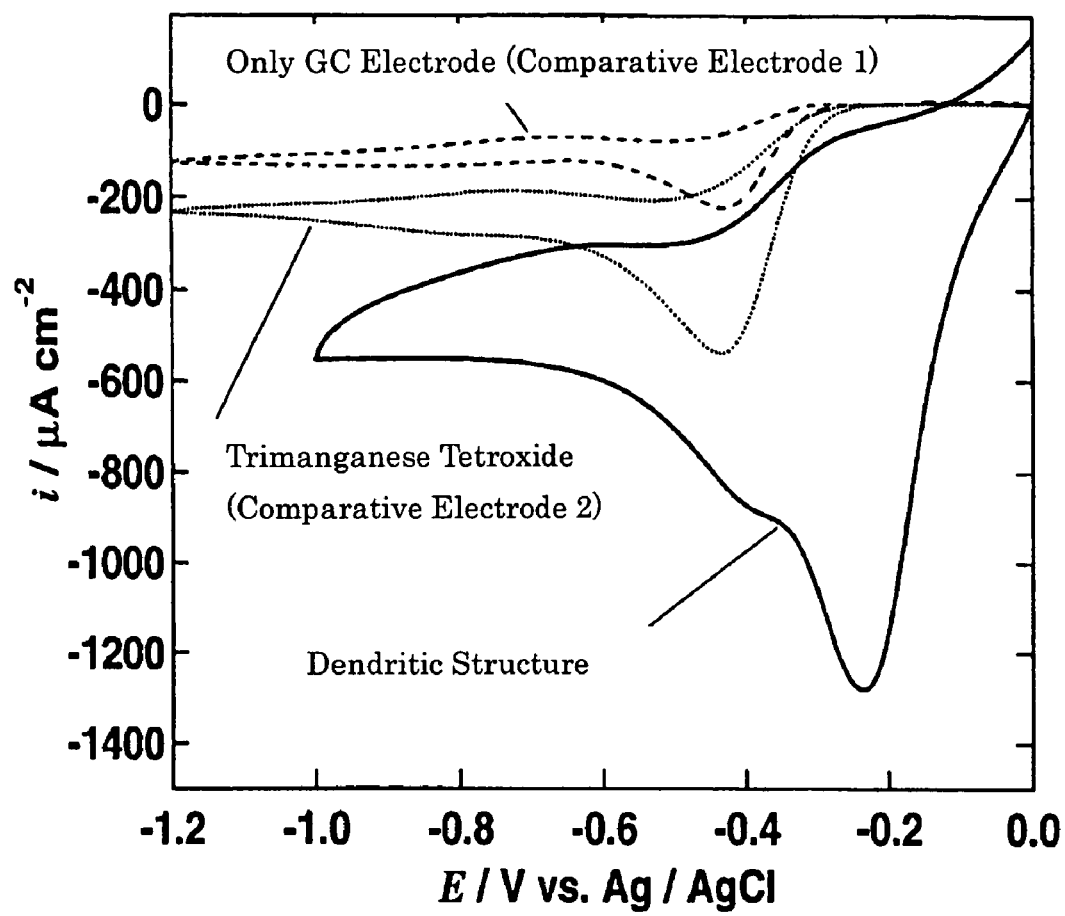
FIG. 13 is a graph of current densities measured in Example 1.

FIG. 13 shows the cyclic voltammogram. In FIG. 13, the oxygen reduction catalytic ability of comparative electrode 1, which comprises only a glassy carbon without supporting nanostructured manganese oxide, is indicated by the dashed curve, that of comparative electrode 2, which supports micron-ordered trimanganese tetroxide powder, is indicated by the dotted curve, and that of the test electrode supporting a nanostructured manganese oxide having a dendritic structure is indicated by the solid curve. The maximum current density of the test electrode was about 5.8 times that of comparative electrode 1 and about 2.4 times that of comparative electrode 2. Furthermore, in the test electrode, the oxygen reduction potential exhibited its maximum current density at around −0.2 V, which is an overvoltage about 0.2 V less than −0.4 V, which is where the maximum current density was observed for comparative electrodes 1 and 2.

It is considered that the above-mentioned results were obtained due to the manganese oxide that serves as a catalyst being formed into a nanostructured manganese oxide of the present invention, which has a dendritic structure in which primary particles having high crystallinity are agglomerated. The test electrode exhibited a high oxygen reduction catalytic ability despite of its very thin catalyst layer of about 14 μm.

Comparative Example 1

(Production of Nanostructures of Other Than a Dendritic Structure)

Figure 8:
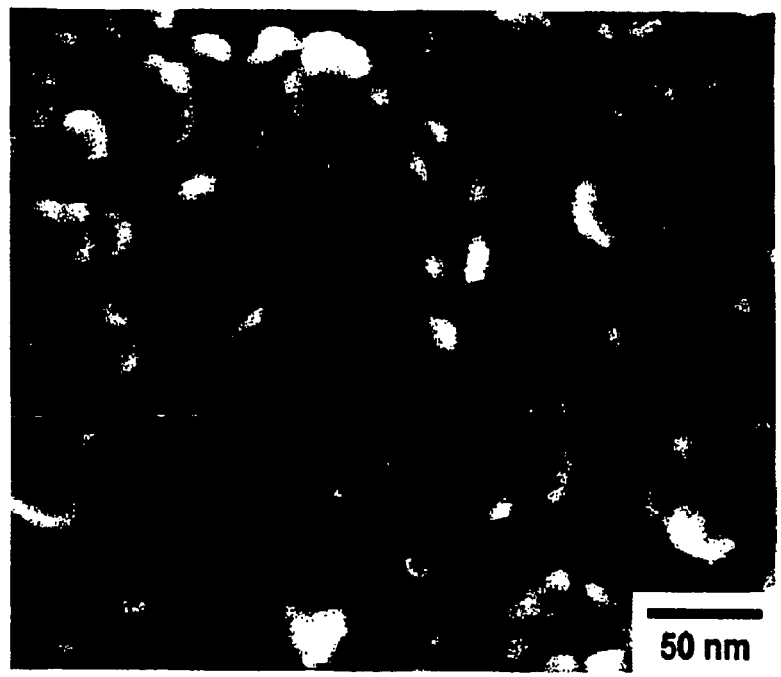
FIG. 8 is scanning electron micrographs of a nanostructured manganese oxide having a columnar structure of Comparative Example 1 in the present specification.
Figure 8:

FIG. 8 is a scanning electron micrograph of a nanostructured manganese oxide of Comparative Example 1.

Nanostructured manganese oxide as shown in FIG. 8 can be produced in the same manner as in Embodiment 1 except for the following points. That is, in Comparative Example 1, He was supplied at 500.0 sccm, and $O_2$ was supplied at a mass flow rate of 0.0 sccm as measured by mass flow rate (therefore, the ratio of the mass flow rate of $O_2$ relative to that of He was 0.00%). The He pressure was 667 Pa.

It was found that the deposited manganese oxide had a nanostructure wherein primary particles were agglomerated to have a columnar structure with height of about 650 nm as shown in FIG. 8. In other words, when $O_2$ was not supplied, a nanostructured manganese oxide having a dendritic structure was not obtained even when deposition was conducted in an on-axis condition.

Furthermore, in the cyclic voltammogram obtained by the cyclic voltammetry method conducted under the same conditions as Example 1, the oxygen reduction potential was observed in the vicinity of 0.4 V.

Comparative Example 2

Figure 10:
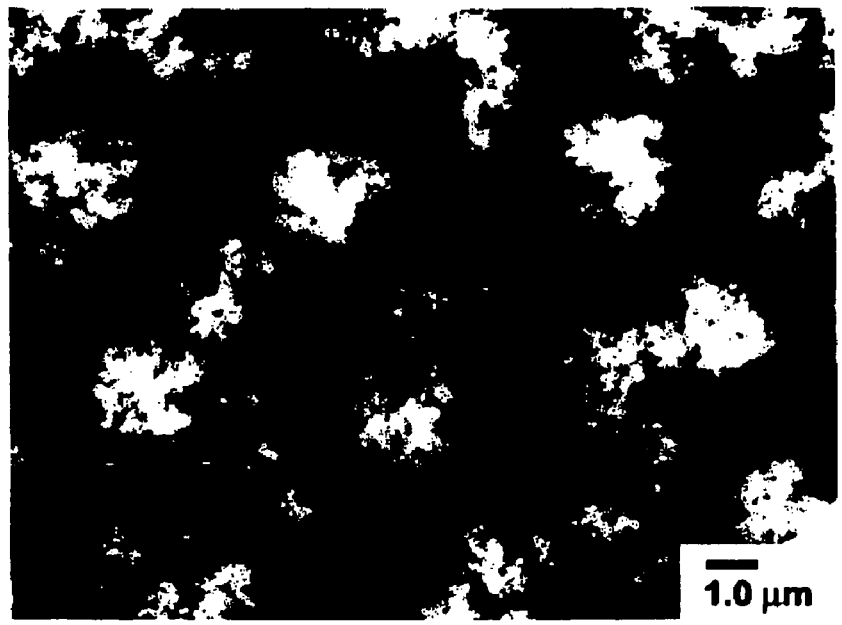
FIG. 10 is scanning electron micrographs showing a nanostructured manganese oxide of Comparative Example 2 of the present specification, which has a cotton candy-like structure.
Figure 10:
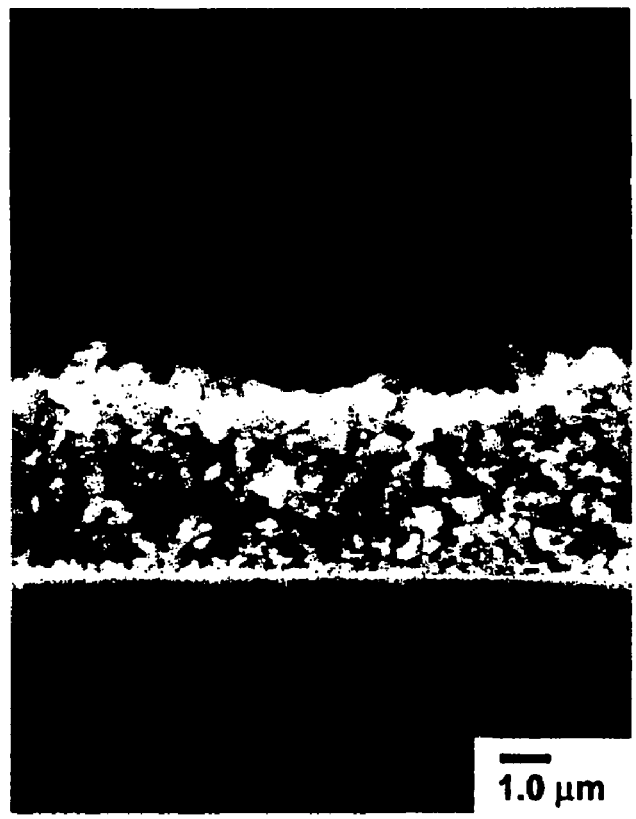

He was supplied at 495.0 sccm and $O_2$ was supplied at 5.0 sccm as measured by mass flow rate (therefore, the ratio of the mass flow rate of $O_2$ relative to that of He was 1.00%), and the pressure of the mixture of He and $O_2$ was 623 Pa, which corresponds to 667 Pa of He of the same mass. A nanostructured manganese oxide was obtained in the same manner as in Embodiment 1 except for the conditions mentioned above. The obtained nanostructured manganese oxide had a cotton candy-like structure as shown in FIG. 10, but no dendritic structure.

Furthermore, in the cyclic voltammogram obtained by the cyclic voltammetry method conducted under the same conditions as Example 1, an oxygen reduction potential was observed in the vicinity of 0.4 V.

Comparative Example 3

An attempt was made to obtain a nanostructured manganese oxide in the same manner as in Embodiment 1 except that the target 307 and the deposition substrate 309 were arranged in an off-axis condition (see FIG. 9(b)); however, merely a thin film of manganese oxide was formed on the deposition substrate 309 and the object nanostructured manganese oxide having a dendritic structure was not obtained.

INDUSTRIAL APPLICABILITY

The production method of the present invention can provide a nanostructured transition metal oxide having a dendritic structure, the nanostructured transition metal oxide having excellent oxygen reduction catalytic abilities and being usable in oxygen reduction electrodes, gas sensors, etc.

The oxygen reduction electrode of the present invention has excellent oxygen reduction catalytic abilities and is useful as an oxygen electrode in, for example, air-zinc batteries, fuel cells, etc.

The invention claimed is:

1. A method for manufacturing a nanostructured manganese oxide having a dendritic structure formed from an agglomeration of primary particles, wherein the method comprises the steps of:
    removing components from a target plate that comprises one or more kinds of manganese oxides by irradiating the target plate with laser light in an atmosphere comprising a mixed gas of inert gas and oxygen gas, the content of the oxygen gas in the mixed gas being no less than 0.05% but no more than 0.5% as measured by mass flow rate; and
    depositing the removed components on a substrate that is opposed to the target plate substantially in parallel to obtain the nanostructured manganese oxide.

2. The method of claim 1, wherein the oxygen reduction potential of the nanostructured manganese oxide is −0.2 V in a cyclic voltammogram employing a cyclic voltammetry, the cyclic voltammetry using a three electrode cell in which the nanostructured manganese oxide is used as the working electrode, platinum is used as the counter electrode, silver/silver chloride is used as the reference electrode, and an aqueous 0.1 mol/l potassium hydroxide solution at pH 13 is used as the electrolyte.

3. The method of claim 1, wherein the inert gas is helium.

4. The method of claim 1, wherein the atmosphere is activated by being energized.

5. The method of claim 1, wherein the atmosphere has a pressure of at least 13.33 Pa but no more than 1333 Pa.

6. The method of claim 1, wherein the laser light is a pulsed laser light which has a pulse duration of at least 5 ns but no more than 20 ns.

7. The method of claim 1, wherein the laser light has an energy density of at least 0.5 $J/cm^2$ but no more than 2 $J/cm^2$.

8. The method of claim 1, wherein the target plate is a manganese oxide sintered body.

9. The method of claim 1, which further comprises a step of heating the obtained nanostructured manganese oxide.

10. The method of claim 1, wherein the pressure of the atmosphere is varied.

11. The method of claim 1, which further comprises a step of positioning the target plate and the substrate in a reaction system in such a manner that they are opposed to each other in parallel prior to all the other steps.

12. The method of claim 1, which further comprises a step of controlling at least one of 1) the pressure of the atmosphere, and 2) the distance between the target plate and the substrate, in order to control the size of the high-temperature and high-pressure region that is formed in the vicinity of the target plate by irradiating the target plate with laser light.

13. An oxygen reduction electrode comprising:
    a nanostructured manganese oxide having a dendritic structure formed from an agglomeration of primary particles, wherein
    the primary particles having a mean diameter of at least 2 nm, but no more than 20 nm and
    the oxygen reduction potential of the nanostructured manganese oxide is −0.2 V in a cyclic voltammogram employing a cyclic voltammetry, the cyclic voltammetry using a three electrode cell in which the nanostructured manganese oxide is used as the working electrode, platinum is used as the counter electrode, silver/silver chloride is used as the reference electrode, and an aqueous 0.1 mol/l potassium hydroxide solution at pH 13 is used as the electrolyte.

14. The oxygen reduction electrode of claim 13, wherein the dendritic structure has a mean height of at least 1 μm but no more than 20 μm.

15. The oxygen reduction electrode of claim 13, wherein the nanostructured manganese oxide comprises at least one manganese oxide selected from the group consisting of manganese monoxide, trimanganese tetroxide, dimanganese trioxide and manganese dioxide.

16. The oxygen reduction electrode of claim 13, wherein the nanostructured manganese oxide is formed on an electrically conductive substrate.

17. The oxygen reduction electrode of claim 15, wherein the nanostructured manganese oxide is formed on an electrically conductive substrate.

* * * * *